(12) United States Patent
Sottke et al.

(10) Patent No.: US 8,828,492 B2
(45) Date of Patent: Sep. 9, 2014

(54) METHOD OF MAKING ALUMINUM OXYNITRIDE COATED ARTICLE

(71) Applicant: Kennametal Inc., Latrobe, PA (US)

(72) Inventors: Volkmar Sottke, Mulheim/Ruhr (DE); Hartmut Westphal, Dermbach/Rhon (DE); Hendrikus Van Den Berg, BT Venlo-Blerick (NL); Zhigang Ban, Latrobe, PA (US); Yixiong Liu, Greensburg, PA (US); Mark S. Greenfield, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 0 days.

(21) Appl. No.: 13/908,097

(22) Filed: Jun. 3, 2013

(65) Prior Publication Data

US 2013/0302521 A1    Nov. 14, 2013

Related U.S. Application Data

(62) Division of application No. 13/048,301, filed on Mar. 15, 2011, now Pat. No. 8,574,728.

(51) Int. Cl.
  *C23C 16/30* (2006.01)
(52) U.S. Cl.
  USPC ........... 427/255.34; 427/255.39; 427/255.394
(58) Field of Classification Search
  CPC ............................... C23C 16/308; C23C 16/30
  USPC ............. 427/255.29, 255.31, 255.32, 255.34, 427/255.39, 255.394
  See application file for complete search history.

(56) References Cited

U.S. PATENT DOCUMENTS

| | | | |
|---|---|---|---|
| 4,336,305 A | 6/1982 | Tanaka | |
| RE32,111 E | 4/1986 | Lambert et al. | |
| 4,707,384 A | 11/1987 | Schachner et al. | |
| 4,749,630 A * | 6/1988 | Konig et al. | 428/698 |
| 4,950,558 A | 8/1990 | Sarin | |
| 5,071,696 A | 12/1991 | Chatfield et al. | |
| 5,075,265 A * | 12/1991 | Narula | 501/96.1 |
| 5,494,743 A | 2/1996 | Woodard et al. | |
| 5,500,279 A | 3/1996 | Walter et al. | |
| 5,618,626 A | 4/1997 | Nagashima et al. | |
| 5,665,431 A | 9/1997 | Narasimhan | |
| 5,709,907 A | 1/1998 | Battaglia et al. | |
| 5,722,803 A | 3/1998 | Battaglia et al. | |
| 5,750,267 A | 5/1998 | Takase et al. | |
| 6,007,908 A | 12/1999 | Reece et al. | |
| 6,010,283 A | 1/2000 | Henrich et al. | |
| 6,022,175 A | 2/2000 | Heinrich et al. | |
| 6,161,990 A | 12/2000 | Oles et al. | |
| 6,183,846 B1 | 2/2001 | Moriguchi et al. | |
| 6,528,180 B1 | 3/2003 | Lee et al. | |
| 6,652,922 B1 | 11/2003 | Forester et al. | |
| 6,811,880 B1 | 11/2004 | Clough | |
| 6,811,881 B1 | 11/2004 | Clough | |
| 6,838,179 B1 | 1/2005 | Legrand | |
| 6,924,037 B1 | 8/2005 | Joret et al. | |
| 6,933,065 B2 | 8/2005 | Arendt et al. | |
| 7,005,189 B1 | 2/2006 | Tachibana et al. | |
| 7,244,520 B2 | 7/2007 | Kumakura et al. | |
| 7,258,927 B2 | 8/2007 | Foltyn et al. | |
| 7,410,707 B2 | 8/2008 | Fukui et al. | |
| 7,531,213 B2 | 5/2009 | Bjormander | |
| 7,541,102 B2 | 6/2009 | Klippe et al. | |
| 7,544,410 B2 | 6/2009 | Lengauer et al. | |
| 7,592,077 B2 | 9/2009 | Gates, Jr. et al. | |
| 7,608,335 B2 | 10/2009 | Findikoglu et al. | |
| 7,659,002 B2 | 2/2010 | Coster et al. | |
| 7,704,611 B2 | 4/2010 | Coddet et al. | |
| 7,727,934 B2 | 6/2010 | Foltyn et al. | |
| 7,736,728 B2 | 6/2010 | Loboda et al. | |
| 7,745,009 B2 | 6/2010 | Decroupet et al. | |
| 7,758,950 B2 | 7/2010 | Moriguchi et al. | |
| 7,782,569 B2 | 8/2010 | Cheng et al. | |
| 7,785,700 B2 | 8/2010 | Okada et al. | |
| 7,829,194 B2 | 11/2010 | Brady et al. | |
| 7,972,684 B2 | 7/2011 | Hara et al. | |
| 7,981,516 B2 | 7/2011 | Labrousse et al. | |
| 8,003,231 B2 | 8/2011 | Yamamoto | |
| 8,017,244 B2 | 9/2011 | Hevesi | |
| 8,192,793 B2 | 6/2012 | Sandberg et al. | |
| 8,247,080 B2 | 8/2012 | Iacovangelo et al. | |

(Continued)

FOREIGN PATENT DOCUMENTS

| | | |
|---|---|---|
| EP | 0704880 A2 | 3/1996 |
| EP | 0784101 B1 | 8/1999 |
| EP | 1724811 A2 | 11/2006 |
| GB | 2038370 A * | 7/1980 |
| JP | 02141495 | 5/1990 |
| WO | 2005118505 A1 | 12/2005 |

(Continued)

OTHER PUBLICATIONS

Ianno, N.J., et al., "Aluminum oxynitride coatings for oxidation resistance of epoxy films". Surface and Coatings Technology 155 (2002) 130-135.*

Erlat, A.G., et al., "Characterisation of aluminum oxynitride gas barrier films". Thin Solid Films 388 (2001) 78-86.*

Moltrecht, Machine Shop Particle, International Press Inc. New York, New York (1981) pp. 199-204.

ASTE Tool Engineers Handbook. McGraw Hill Book Co. New York, New York (1949) pp. 302-315.

*Primary Examiner* — Bret Chen

(74) *Attorney, Agent, or Firm* — Matthew W. Gordon, Esq.

(57) ABSTRACT

A method for making a coated article wherein the method includes the following steps: providing a substrate; and depositing an aluminum oxynitride coating layer from a gaseous mixture. The gaseous mixture contains the following components: 30.0-65.0 volume percent nitrogen, 0.7-1.3 volume percent aluminum tri-chloride; 1.0-2.0 volume percent ammonia, 0.1-1.5 carbon dioxide, 1.5-4.5 volume percent hydrogen chloride, optional components of carbon monoxide and/or argon, and hydrogen as the balance.

17 Claims, 8 Drawing Sheets

(4 of 8 Drawing Sheet(s) Filed in Color)

(56) References Cited

U.S. PATENT DOCUMENTS

| | | |
|---|---|---|
| 2003/0044652 A1 | 3/2003 | Wang |
| 2003/0134039 A1 | 7/2003 | Ross et al. |
| 2003/0175557 A1 | 9/2003 | Anderson et al. |
| 2004/0076764 A1 | 4/2004 | Forester et al. |
| 2004/0209126 A1 | 10/2004 | Ziegler et al. |
| 2005/0008883 A1 | 1/2005 | Takagi et al. |
| 2005/0025973 A1 | 2/2005 | Slutz et al. |
| 2005/0064247 A1 | 3/2005 | Sane et al. |
| 2006/0008676 A1 | 1/2006 | Ebata et al. |
| 2006/0019118 A1 | 1/2006 | Gates, Jr. et al. |
| 2006/0093758 A1 | 5/2006 | Sakakura et al. |
| 2006/0127699 A1 | 6/2006 | Moelle et al. |
| 2006/0159912 A1 | 7/2006 | Haldeman |
| 2006/0182991 A1 | 8/2006 | Tauchi et al. |
| 2006/0204772 A1 | 9/2006 | Mukunoki et al. |
| 2006/0234064 A1 | 10/2006 | Baubet et al. |
| 2006/0240266 A1 | 10/2006 | Schicht et al. |
| 2007/0030569 A1 | 2/2007 | Lu et al. |
| 2007/0172696 A1 | 7/2007 | Tong et al. |
| 2007/0237699 A1 * | 10/2007 | Clark ........................... 423/263 |
| 2008/0118762 A1 | 5/2008 | Morimoto et al. |
| 2008/0176108 A1 * | 7/2008 | Cheng et al. .................. 428/814 |
| 2009/0269486 A1 * | 10/2009 | Yamazaki et al. .............. 427/66 |
| 2010/0062245 A1 | 3/2010 | Martin et al. |
| 2010/0109058 A1 * | 5/2010 | Sakata et al. ................... 257/288 |
| 2010/0132762 A1 | 6/2010 | Graham, Jr. et al. |
| 2010/0242265 A1 | 9/2010 | Wadley et al. |
| 2010/0247930 A1 | 9/2010 | Zurbuchen |
| 2010/0255337 A1 | 10/2010 | Langhorn |
| 2011/0102968 A1 | 5/2011 | Choi et al. |
| 2011/0151173 A1 | 6/2011 | Ramadas et al. |
| 2012/0144965 A1 | 6/2012 | Engstrom |
| 2012/0207948 A1 | 8/2012 | Lee |
| 2012/0237794 A1 | 9/2012 | Sottke et al. |
| 2012/0258294 A1 | 10/2012 | Leyder et al. |
| 2012/0258295 A1 | 10/2012 | Leyder et al. |

FOREIGN PATENT DOCUMENTS

| | | |
|---|---|---|
| WO | 2006005067 A2 | 1/2006 |
| WO | 2006007728 A1 | 1/2006 |
| WO | 2007001337 A2 | 1/2007 |
| WO | 2007005925 A1 | 1/2007 |
| WO | 2007018974 A2 | 2/2007 |

* cited by examiner

METHOD OF MAKING ALUMINUM OXYNITRIDE COATED ARTICLE

CROSS-REFERENCE TO EARLIER CO-PENDING PATENT APPLICATION

This patent application is a divisional patent application of earlier filed and co-pending U.S. patent application Ser. No. 13/048,301 filed Mar. 15, 2011 for ALUMINUM OXYNITRIDE COATED ARTICLE AND METHOD OF MAKING THE SAME by Volkmar Sottke et al. Applicants herein claim under the United States Patent Statute (Title 35, United States Code) including 35 U.S.C. §120 the benefit of the filing date of such earlier parent patent application (Ser. No. 13/048,301, filed Mar. 15, 2011). Further, applicants hereby incorporate by reference herein the entirety of the above—U.S. patent application Ser. No. 13/048,301 [filed Mar. 15, 2011].

BACKGROUND OF THE INVENTION

The invention pertains to a coated article such as, for example, a coated cutting tool, a coated (solid) carbide drill and an end mill. The invention further pertains to a coated wear part such as, for example, valve body, punches and dies. More specifically, the invention pertains to a coated article such as a cutting tool or wear part that has a substrate and a coating scheme on the substrate. The coating scheme includes a coating layer of aluminum oxynitride deposited via chemical vapor deposition (CVD). The coating scheme further includes, in general, one or more other coating layers.

The invention also pertains to a method of making a coated article such as a cutting tool or wear part with an aluminum oxynitride coating layer. The method includes providing a substrate, and then depositing by chemical vapor deposition a coating scheme. The coating scheme includes at least one coating layer of aluminum oxynitride. The gaseous mixture includes the following gases: hydrogen, nitrogen, aluminum tri-chloride, carbon dioxide, hydrogen chloride, ammonia, and optionally carbon monoxide and/or argon.

Heretofore, in U.K. Patent Application GB 2 038 370 A to Fried Krupp, a cutting insert includes a coating scheme, which includes a metal oxynitride coating layer wherein the metal may be aluminum, titanium or zirconium. In one example, an indexable cutting insert of hard material was coated with a titanium carbide layer from a gaseous mixture of $TiCl_4$ and $CH_4$. Next, the titanium carbide coating layer was coated with a layer of $Al_2O_{2.8}N_{0.2}$ with a nitrogen content equal to 4 atom %. The gaseous mixture comprised 50% $H_2$, 46.6% $N_2$, 0.4% $NH_4$, 2% $CO_2$ and 1% $AlCl_3$. See page 1, lines 51-59.

In U.S. Pat. No. 4,950,558 to Sarin, a ceramic substrate has a coating scheme thereon. One of the coating layers comprises $Al_xO_yN_z$, which is a compositionally graded coating. According to the Sarin patent (see Col. 5, lines 21-39), the aluminum oxynitride coating layer may be deposited by simultaneously carrying out the following reactions:

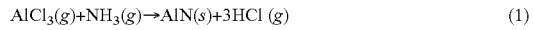

$$AlCl_3(g) + NH_3(g) \rightarrow AlN(s) + 3HCl(g) \quad (1)$$

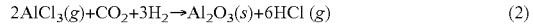

$$2AlCl_3(g) + CO_2 + 3H_2 \rightarrow Al_2O_3(s) + 6HCl(g) \quad (2)$$

In the examples, the aluminum oxynitride coating layer has a graded composition.

Even though earlier products included a CVD coating layer of aluminum oxynitride, there remains a need to provide a coated article such as a cutting tool or wear part, which has a coating scheme including an aluminum oxynitride coating layer, with improved performance properties. Such a coated cutting tool or wear part exhibits an aluminum oxynitride coating layer that has reduced tensile stress up to moderate compressive stress. The condition of reduced tensile stress or moderate compressive stress can be due to one or more of a lower thermal expansion property, a good thermal stability, or a high hardness.

It would be highly desirable to provide an improved coated article such as a coated cutting tool or coated wear part with a coating scheme that includes a coating layer of aluminum oxynitride wherein the cutting insert, as well as the wear part, has improved performance properties. These improved performance properties include increased wear resistance and increased thermal shock resistance. Further, it would be highly desirable to provide a coated article such as a coated cutting tool or coated wear part, which has an aluminum oxynitride coating layer that exhibits a reduced tensile stress up to moderate compressive stress. By providing an aluminum oxynitride coating layer with a reduced tensile stress up to moderate compressive stress, the coated article exhibits a resistance to crack growth. In this kind of a coating, a condition of tensile stress supports crack growth and a condition of compressive stress avoids cracks and crack growth. Avoidance of cracks and crack growth is particularly advantageous in an application like interrupted cutting.

Further still, it would be highly desirable to provide a coated article such as a coated cutting tool or coated wear part, which has an aluminum oxynitride coating layer that has a lower thermal expansion property, i.e., no micro cracks seen at the surface of the coating. In a quantitative sense, this means zero cracks occurrence observed in the crater cross section of the coatings under 30× optical microscope. By providing an aluminum oxynitride coating layer with a lower thermal expansion property, the coated article eliminates the occurrence of thermal cracking which is beneficial in improving the thermal shock resistance of the cutting tools.

In addition, it would be highly desirable to provide a coated article such as a coated cutting insert or a coated wear part, which has an aluminum oxynitride coating layer that exhibits a good thermal stability, i.e., the coating still exists after heat treatment in a vacuum for 2 hours at 1200° C. This means no phase transformation detectable by X-ray diffraction. By providing an aluminum oxynitride coating layer with a good thermal stability, the coated article exhibits improved wear resistance.

Finally, it would be highly desirable to provide a coated article such as a coated cutting insert or a coated wear part, which has an aluminum oxynitride coating layer that exhibits a high hardness, i.e., a hardness value $H_{v0.5}$ equal to at least about 2200 when measured per ISO 3878. By providing an aluminum oxynitride coating layer with a high hardness, the coated article exhibits improved wear resistance.

SUMMARY OF THE INVENTION

In one form thereof, the invention is a method for making a coated article, the method comprising the steps of: providing a substrate; depositing an aluminum oxynitride coating layer from a gaseous mixture, the gaseous mixture comprising: nitrogen in an amount between about 30.0 volume percent and about 65.0 volume percent of the gaseous mixture; aluminum tri-chloride in an amount between about 0.7 volume percent and about 1.3 volume percent of the gaseous mixture; ammonia in an amount between about 1.0 volume percent and about 2.0 volume percent of the gaseous mixture; carbon dioxide in an amount between about 0.1 volume percent and about 1.5 volume percent of the gaseous mixture; hydrogen chloride in an amount between about 1.5 volume percent and about 4.5 volume percent of the gaseous mixture; carbon monoxide optionally in an amount between about 0 volume percent and about 2.0 volume percent of the gaseous mixture; argon optionally in an amount between about 0 volume percent and about 25 volume percent of the gaseous mixture; and hydrogen remains the balance of the gaseous mixture.

In another form thereof, the invention is coated article. The coated article has a substrate, which has a substrate surface, and a coating scheme on the substrate. The coating scheme comprises a titanium-containing coating layer, and an aluminum oxynitride coating layer on the titanium-containing coating layer. The aluminum oxynitride comprises a mixture of phases having a hexagonal aluminum nitride type structure (space group: P63mc), a cubic aluminum nitride type structure (space group: Fm-3m) and optionally amorphous structure. The aluminum oxynitride coating layer has a composition comprising aluminum in an amount between about 20 atomic percent and about 50 atomic percent, nitrogen in an amount between about 40 atomic percent and about 70 atomic percent, and oxygen in an amount between about 1 atomic percent and about 20 atomic percent.

In still another form thereof, the invention is a coated article made by the method comprising the steps of: providing a substrate; depositing an aluminum oxynitride coating layer from a gaseous mixture, the gaseous mixture comprising: nitrogen in an amount between about 30.0 volume percent and about 65.0 volume percent of the gaseous mixture; aluminum tri-chloride in an amount between about 0.7 volume percent and about 1.3 volume percent of the gaseous mixture; ammonia in an amount between about 1.0 volume percent and about 2.0 volume percent of the gaseous mixture; carbon dioxide in an amount between about 0.1 volume percent and about 1.5 volume percent of the gaseous mixture; hydrogen chloride in an amount between about 1.5 volume percent and about 4.5 volume percent of the gaseous mixture; carbon monoxide optionally in an amount between about 0 volume percent and about 2.0 volume percent of the gaseous mixture; argon optionally in an amount between about 0 volume percent and about 25 volume percent of the gaseous mixture; and hydrogen remains the balance of the gaseous mixture.

BRIEF DESCRIPTION OF THE DRAWINGS

The patent or application file contains at least one drawing executed in color. Copies of this patent or application publication with color drawing(s) will be provided by the office upon request and payment of the necessary fee.

The following is a brief description of the drawings that form a part of this patent application.

DETAILED DESCRIPTION

Figure 1:
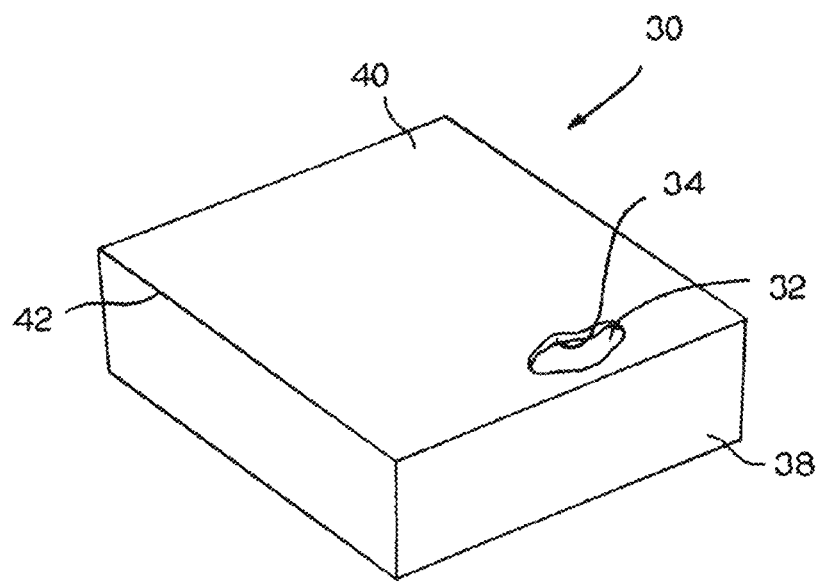
FIG. 1 is an isometric view of a representative coating cutting insert with a portion of the coating scheme removed to expose the underlying substrate.

Referring to the drawings, FIG. 1 is an isometric view of a representative coated cutting insert (coated article) generally designated as 30. Coated cutting insert 30 has a substrate 32, which is visible because a portion of the coating layer has been removed, and a coating scheme 34. Coated cutting insert 30 has a flank face 38 and a rake face 40 wherein a cutting edge 42 is at the juncture of the flank face 38 and the rake face 40. Coated cutting insert 30 is suitable for use in a chipforming material removal operation.

In a chipforming material removal operation, the cutting insert engages a workpiece to remove material from a workpiece typically in the form of chips. A material removal operation that removes material from the workpiece in the form of chips typically is known by those skilled in the art as a chipforming material removal operation. The book *Machine Shop Practice* [Industrial Press Inc., New York, N.Y. (1981)] by Moltrecht presents at pages 199-204 a description, inter alia, of chip formation, as well as different kinds of chips (i.e., continuous chip, discontinuous chip, segmental chip). Moltrecht reads [in part] at pages 199-200, "When the cutting tool first makes contact with the metal, it compresses the metal ahead of the cutting edge. As the tool advances, the metal ahead of the cutting edge is stressed to the point where it will shear internally, causing the grains of the metal to deform and to flow plastically along a plane called the shear plane . . . . When the type of metal being cut is ductile, such as steel, the chip will come off in a continuous ribbon . . . ". Moltrecht goes on to describe formation of a discontinuous chip and a segmented chip.

As another example, the text found at pages 302-315 of the *ASTE Tool Engineers Handbook*, McGraw Hill Book Co., New York, N.Y. (1949) provides a lengthy description of chip formation in the metal cutting process. At page 303, the ASTE Handbook makes the clear connection between chip formation and machining operations such as turning, milling and drilling. The following patent documents discuss the formation of chips in a material removal operation: U.S. Pat. No. 5,709,907 to Battaglia et al. (assigned to Kennametal Inc.), U.S. Pat. No. 5,722,803 to Battaglia et al. (assigned to Kennametal Inc.), and U.S. Pat. No. 6,161,990 to Oles et al. (assigned to Kennametal Inc.).

Figure 2:
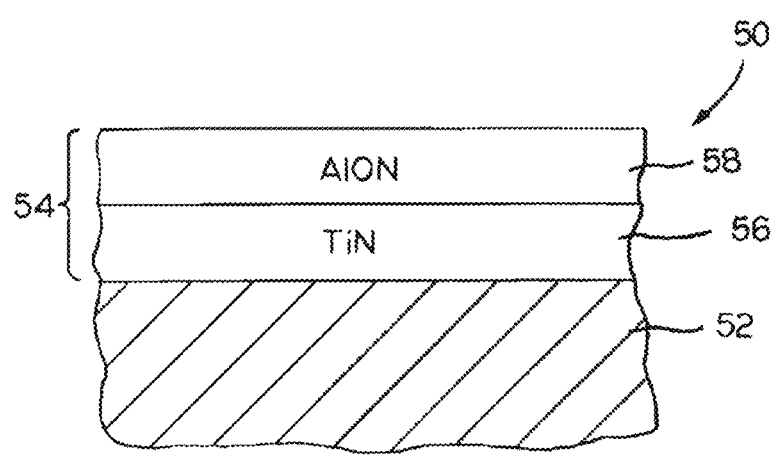
FIG. 2 is a schematic cross-sectional view of one specific embodiment of a coating scheme.
Figures 3, 4:
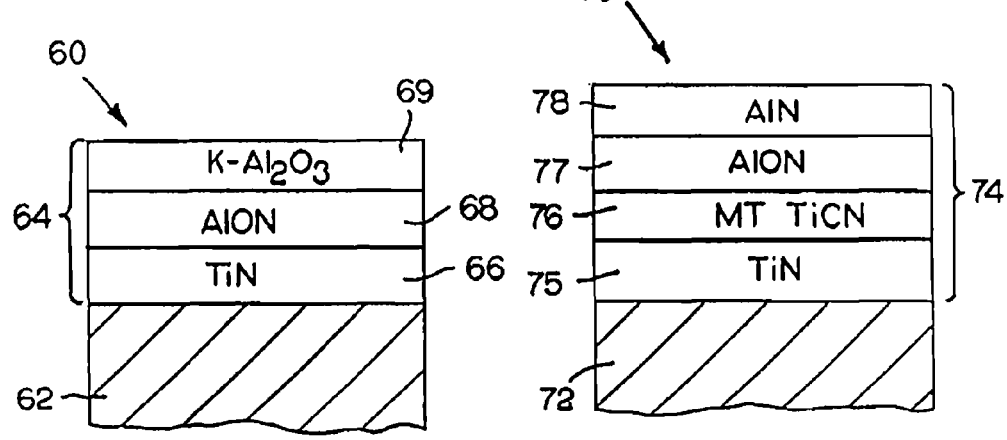
FIG. 3 is a schematic cross-sectional view of a second specific embodiment of a coating scheme.
FIG. 4 is a schematic cross-sectional view of a third specific embodiment of a coating scheme.

As described hereinabove, the coated article also encompasses a coated wear part. A coated wear part includes without limitation the following parts: valve body, punches and dies Specific coating schemes are shown in FIGS. 2 through 5. FIG. 2 shows in schematic form a section of a coated cutting insert 50. Even though these drawings illustrate a coated cutting insert (or cutting tool), there should be an appreciation that the coating scheme is applicable to a wear part. The coated cutting insert 50 has a substrate 52 and a coating scheme 54 thereon. The coating scheme 54 includes a base coating layer 56 of titanium nitride and a coating layer 58 of aluminum oxynitride on the base coating layer. FIG. 3 shows in schematic form a section of a coated cutting insert 60. The coated cutting insert 60 has a substrate 62 and a coating scheme 64 thereon. The coating scheme 64 includes a base coating layer 66 of titanium nitride and an intermediate coating layer 68 of aluminum oxynitride on the base coating layer.

An outer coating layer 69 of kappa-aluminum oxide is on the aluminum oxynitride coating layer.

FIG. 4 shows in schematic form a section of a coated cutting insert 70. Even though this drawing illustrates a coated cutting insert (or cutting tool), there should be an appreciation that the coating scheme is applicable to a wear part. The coated cutting insert 70 has a substrate 72 and a coating scheme 74 thereon. The coating scheme 74 includes a base coating layer 75 of titanium nitride and an intermediate coating layer 76 of MT-titanium carbonitride. An aluminum oxynitride coating layer 77 is on the intermediate coating layer 76. An outer coating layer of aluminum nitride 78 is on the aluminum oxynitride coating layer is on the aluminum oxynitride coating layer 77.

Figure 5:
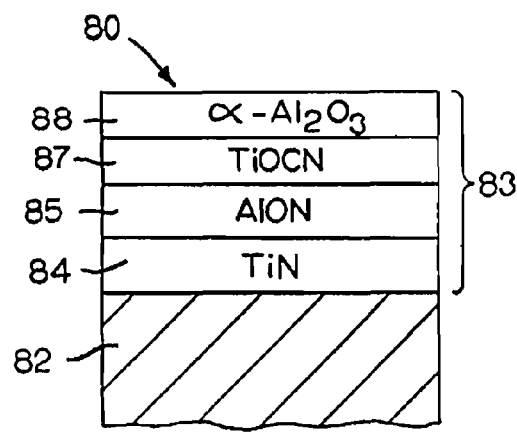
FIG. 5 is a schematic cross-sectional view of a fourth specific embodiment of a coating scheme.

FIG. 5 shows in schematic form a section of a coated cutting insert 80. Even though this drawing illustrates a coated cutting insert (or cutting tool), there should be an appreciation that the coating scheme is applicable to a wear part. The coated cutting insert 80 has a substrate 82 and a coating scheme 83 thereon. The coating scheme 83 includes a base coating layer 84 of titanium nitride and a coating layer 85 of aluminum oxynitride on the base coating layer. A coating layer 87 of titanium oxycarbonitride is on the aluminum oxynitride coating layer 85. The outer coating layer 88 is alpha-alumina and is on the titanium oxycarbonitride coating layer.

As mentioned above, the aluminum oxynitride coating layer is deposited via chemical vapor deposition (CVD). The basic processing parameters (e.g., temperature, pressure and gas composition) for the deposition of the aluminum oxynitride coating layer are set forth in Table I below. In reference to the temperature and the pressure, there is a broader range and a narrower, preferred (or preferably) range. The gas composition is in volume percent of the gaseous mixture.

TABLE I

| Ranges of Processing Parameters for AlON Coating | |
| --- | --- |
| Temperature | 750° C.-1020° C., preferably 850-980° C. |
| Pressure | 10 mbar-900 mbar, preferably 50-100 mbar |
| $H_2$ | balance |
| $N_2$ | 30-65 vol. % |
| $AlCl_3$ | 0.7-1.3 vol. % |
| $NH_3$ | 1-2 vol. % |
| $CO_2$ | 0.1-1.5 vol. % |
| HCl | 1.5-4.5 vol. % |
| CO | 0-2.0 vol. % |
| Ar | 0-25 vol. % |

Specific compositions (in volume percent) of gaseous mixtures, as well as pressures and temperatures, used to deposit six different aluminum oxynitride coating layers are set forth in Table II below.

As set forth above, the composition is in volume percent of the gaseous mixture. The temperature is in ° C. (degrees Centigrade) and the pressure is in millibars (mbar).

Specific examples, i.e., Examples 1 through 4, of the method to form a coated cutting insert, which includes a step to deposit the aluminum oxynitride coating layer, are set forth hereinafter. Although the specific examples do not include carbon monoxide or argon, these gases are useful in the process of the invention. In this regard, carbon monoxide can be used to balance the reaction balance for lowering the deposition rate of the aluminum oxynitride coating layer. Argon can be used to provide for a uniform thickness distribution of the aluminum oxynitride coating layer due to the high viscosity of the as-deposited material. Carbon monoxide and argon do not have an influence on the chemical composition of the aluminum oxynitride coating layer.

Example 1 is a coated cutting insert that comprises a substrate with an inventive TiN—AlON coating scheme thereon. The substrate comprises WC with 6.1 wt % Co and 0.15wt % vanadium. This substrate has the following properties: average grain size of the tungsten carbide is between about 1 and about 2 micrometers, porosity is A02, B02, C00, the specific gravity is between about 14.7 and about 15.1 $g/cm^3$, the Rockwell A hardness is between about 91.5 and about 92.3, the magnetic saturation is between 9.9 and 11.7 μTm3/kg, and the coercive force is between about 200 and about 243 oersteds.

The coating scheme comprises a base coating layer of titanium nitride, which has a thickness equal to about 0.5 micrometers. There should be an appreciation that the thickness of the titanium nitride coating layer can range between about 0.1 micrometers and about 3 micrometers. An aluminum oxynitride coating layer is on the base coating layer. The thickness of the aluminum oxynitride coating layer is equal to 5 micrometers. There should be an appreciation that the thickness of the aluminum oxynitride coating layer can range between about 3 micrometers and about 10 micrometers. The processing details for the specific process (gas compositions, concentrations, duration, temperature and pressure) to produce the coated cutting insert of Example 1 is set forth in Table III below.

TABLE III

| Process Parameters for Inventive Coating Process of Example 1 (TiN—AlON) | | | | |
| --- | --- | --- | --- | --- |
| Materials | Temperature (° C.) | Pressure (mbar) | Total Time (minutes) | Gases Present [Vol. %] |
| TiN | 950 | 700 | 60 | $H_2$ [52.8 vol %] + $N_2$ [46 vol %] + $TiCl_4$ [1.2 vol %] |
| AlON* | 950 | 80 | 180 | $H_2$ + $N_2$ + $AlCl_3$ + $CO_2$ + HCl + $NH_3$ |

TABLE II

| Specific Examples for AlON Coating Parameters (gas in volume percentage) | | | | | | | |
| --- | --- | --- | --- | --- | --- | --- | --- |
| | $H_2$ % | $N_2$ % | $AlCl_3$ % | $NH_3$ % | $CO_2$ % | HCl % | Temperature (° C.) | Pressure (mbar) |
| Example A | balance | 36.6 | 0.9 | 1.5 | 0.4 | 2.2 | 950 | 80 |
| Example B | balance | 36.3 | 0.9 | 1.5 | 1.1 | 2.2 | 950 | 80 |
| Example C | balance | 36.4 | 0.9 | 1.5 | 0.9 | 2.2 | 950 | 80 |
| Example D | balance | 44.4 | 0.8 | 1.3 | 1.0 | 1.9 | 870 | 80 |
| Example E | balance | 63.5 | 0.8 | 1.3 | 0.8 | 1.9 | 930 | 80 |
| Example F | balance | 62.7 | 0.8 | 1.3 | 0.8 | 3.1 | 980 | 80 |

The aluminum oxynitride coating layer (AlON) was deposited using the specific parameters as set forth for Example B in Table II hereof.

The composition of the aluminum oxynitride coating layer was determined by glow discharge spectrum (GDOES). The specific technique comprises the GDA 750 equipment (Spectrum Analytic Ltd. Hof Germany). The spot diameter has been used with 1.0 mm. The sputtered material removal for the analysis has been done with 0.5 μm steps from the top to the substrate side. The average composition (atomic percent) was: Al (atom %)=35%; N (atom %)=65%; and O (atom %)=5%.

Figure 6:
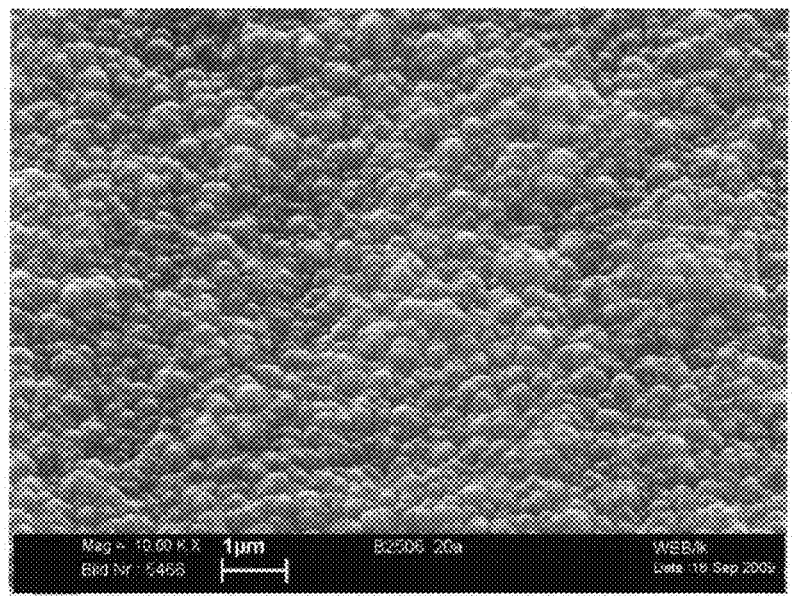
FIG. 6 is a photomicrograph (magnification equal to 10,000×) of the surface of the aluminum oxynitride coating layer of Example 1.
Figure 7:
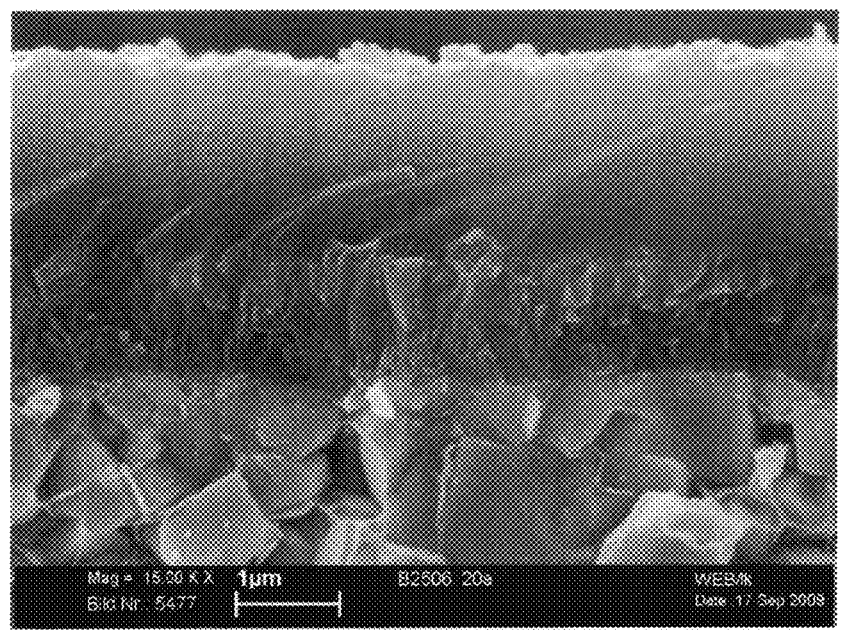
FIG. 7 is a photomicrograph (magnification equal to 15,000×) showing in cross section the coating scheme of Example 1.
Figure 8:
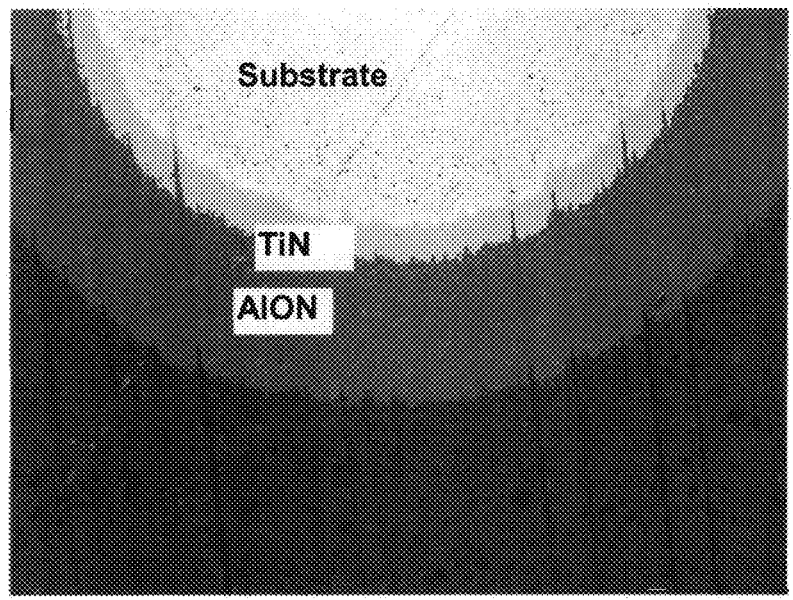
FIG. 8 is a photomicrograph in section showing the coating sequence of Example 1.

FIG. 6 is a photomicrograph that shows the surface morphology of the aluminum oxynitride coating layer of Example 1. In reference to FIG. 6, the coating consists of a dome shaped cluster of ultrafine grains. FIG. 7 is a photomicrograph showing the coating scheme in cross section. In reference to FIG. 7, the smooth cleavage of the cross section further indicates the ultrafine grains structure of the coating layer. FIG. 8 is a photomicrograph showing the coating cross-section in a crater. In reference to FIG. 8, the coating sequence of titanium nitride and aluminium oxynitride coating layers can be seen. By a visual examination under an optical microscope at 30×, there were no visible microcracks in the aluminium oxynitride coating layer.

Figure 9:
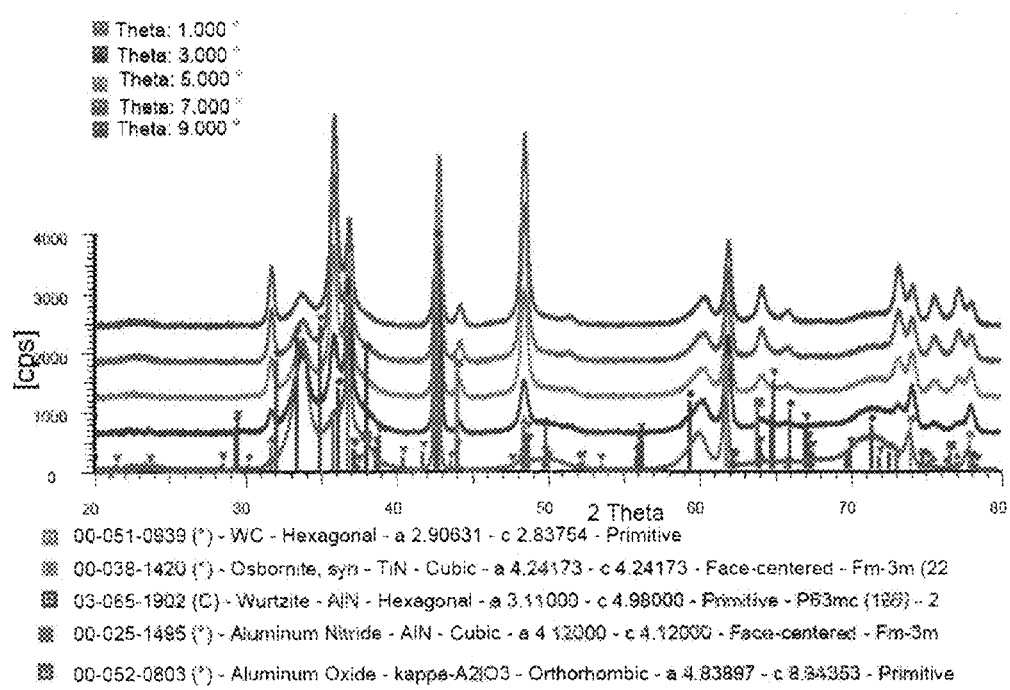
FIG. 9 is a grazing-incidence x-ray diffraction pattern for the aluminum oxynitride coating layer of Example 1 wherein the incidence angles are 1°, 3°, 5°, 7°, and 9°.

FIG. 9 is an x-ray diffraction (XRD) pattern for the aluminum oxynitride coating layer of Example 1. The x-ray diffraction results show that the aluminum oxynitride comprises a mixture of phases having a hexagonal aluminum nitride type structure (space group: P63mc), a cubic aluminum nitride type structure (space group: Fm-3m). The XRD result also indicates presence of amorphous phases in the coating. In regard to the XRD results has been used the diffractometer type D5000 (Siemens) with Bragg-Brentano graizing-incedenz system and X-ray Cu Kα with Ni filter (λ 0.15478 nanometers). Parameters for the XRD analysis are listed in FIG. 9.

Example 2 is a coated cutting insert that comprises a substrate with an inventive TiN-AlON-κ-Al$_2$O$_3$ coating scheme thereon. The substrate comprises WC with 12.2 wt % Co and the sum of the contents of tantalum, niobium and vanadium comprising 2.3 wt %. This substrate has the following properties: average grain size of the tungsten carbide is between about 1 and about 3 micrometers, porosity is A02, B02, C00; the specific gravity is between about 14 and about 14.4 g/cm$^3$, the Rockwell A hardness is between about 89 and about 90, the magnetic saturation is between 19.5 and 23.3, and the coercive force is between about 136 and about 166 oersteds.

The inventive coating scheme comprises a base coating layer of titanium nitride, which has a thickness equal to 0.5 micrometers. There should be an appreciation that the thickness of the titanium nitride coating layer can range between about 0.1 micrometers and about 3 micrometers. The coating scheme further includes an aluminum oxynitride coating layer, which has a thickness equal to 4 micrometers, on the base coating layer. There should be an appreciation that the thickness of the aluminum oxynitride coating layer can range between about 3 micrometers and about 10 micrometers. Finally, the coating scheme includes a coating layer of kappa-aluminum oxide, which has a thickness equal to 3 micrometers, on the aluminum oxynitride coating layer. There should be an appreciation that the thickness of the kappa-aluminum oxide coating layer can range between about 2 micrometers and about 6 micrometers. The processing details for the specific process (gas compositions, concentrations, duration, temperature and pressure) to produce the coated cutting insert of Example 2 is set forth in Table IV below.

TABLE IV

Process Parameters for Inventive Coating Process of Example 2 (TiN—AlON-Kappa Al$_2$O$_3$)

| Materials | Temperature (° C.) | Pressure (mbar) | Total Time (minutes) | Gases Present (vol %) |
|---|---|---|---|---|
| TiN | 950 | 700 | 60 | H$_2$ [52.8 vol %] + N$_2$ [46 vol %] + TiCl$_4$ [1.2 vol %] |
| AlON | 950 | 80 | 150 | H$_2$ + N$_2$ + AlCl$_3$ + CO$_2$ + HCl + NH$_3$ |
| Al$_2$O$_3$ | 990 | 80 | 120 | H$_2$ [balance] + AlCl$_3$ [2.7 vol %] + CO$_2$ [3.4 vol %] + HCl [4.2 vol %] + TiCl$_4$ [0.7 vol %] + CH$_4$ [4.2 vol %] |

The aluminum oxynitride coating layer (AlON) was deposited using the specific parameters as set forth for Example B in Table II hereof.

Figure 10:
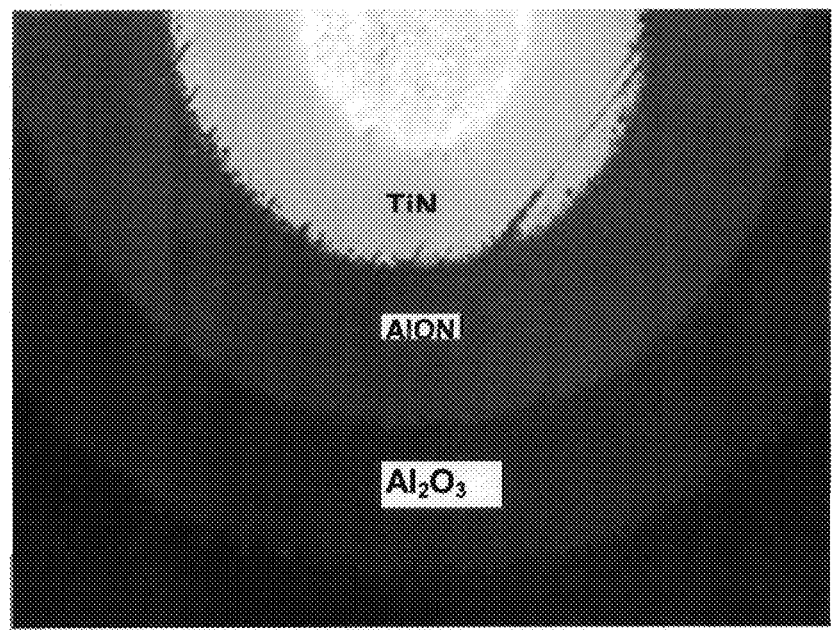
FIG. 10 is a photomicrograph in section showing the coating sequence of Example 2.

FIG. 10 is a photomicrograph showing the coating scheme of Example 2 in cross-section in a crater. In reference to FIG. 10, coating sequence of titanium nitride, aluminium oxynitride and aluminium oxide coating layers can be seen. By a visual examination under an optical microscope at 30×, there are no visible microcracks in the aluminium oxynitride coating layer Metal cutting tests were conducted to compare the cutting performance of coated cutting inserts of Example 2 against the cutting performance of a conventional coated cutting insert. The conventional coated cutting insert has a substrate of WC with 12.2 wt % Co and the sum of the contents of tantalum, niobium and vanadium comprising 2.3 wt %. This substrate has the following properties: average grain size of the tungsten carbide is between about 1 and about 3 micrometers, porosity is A02, B02, C00; the specific gravity is between about 14 and about 14.4 g/cm$^3$, the Rockwell A hardness is between about 89 and about 90, the magnetic saturation is between 19.5 and 23.3, and the coercive force is between about 136 and about 166 oersteds.

The coating scheme for the conventional coating cutting insert comprises: a base coating layer of TiN (thickness equal to 1 micrometers), an intermediate coating layer of MT (moderate temperature)-TiCN (thickness equal to 4 micrometers), and an outer coating layer of kappa-alumina (thickness equal to 2 micrometers). The cutting parameters for the milling test are set forth below:

Work piece: 42 Cr Mo 4 V Insert: HNGJ0905ANSN-GD
Cutting speed (m/min): 250
Axial depth of cut (mm): 2.0
Radial depth of cut (mm): 120
Feed rate (mm/tooth): 0.3
Coolant=Yes.

The results of the metal cutting tests are set forth in Table V. The results are set forth in minutes until failure wherein the failure mode and criteria is microchipping on the cutting edge as determined by visual inspection.

TABLE V

Results of Metalcutting Tests for Coated Cutting Insert of Example 2

| Cutting Insert | Repetition 1/ Failure Mode | Repetition 2/ Failure Mode |
|---|---|---|
| Inventive Coated Cutting Insert of Example 2 | 16.08/microchipping on cutting edge | 15.28/microchipping on cutting edge |

TABLE V-continued

Results of Metalcutting Tests for Coated Cutting Insert of Example 2

| Cutting Insert | Repetition 1/ Failure Mode | Repetition 2/ Failure Mode |
|---|---|---|
| Conventional Coated Cutting Insert | 13.40/microchipping on cutting edge | 10.72/microchipping on cutting edge |

It was seen that the microchipping on cutting edge was caused by thermal cracks

Looking at the average of the above results, these results show a thirty percent (30%) improvement of performance for the inventive coated cutting insert of Example 2 as compared to the conventional coated cutting insert.

Example 3 is a coated cutting insert that comprises a substrate with an inventive TiN—(MT)TiCN—AlON—AlN coating scheme thereon. The substrate comprises WC with 6.1 wt % Co and 0.15wt % vanadium. This substrate has the following properties: average grain size of the tungsten carbide is between about 1 and about 2 micrometers, porosity is A02, B02, C00, the specific gravity is between about 14.7 and about 15.1 g/cm$^3$, the Rockwell A hardness is between about 91.5 and about 92.3, the magnetic saturation is between 9.9 and 11.7 µTm3/kg, and the coercive force is between about 200 and about 243 oersteds.

The inventive coating scheme comprises a base coating of titanium nitride, which has a thickness equal to 0.5 micrometers. There should be an appreciation that the thickness of the coating layer can range between about 0.1 micrometers and about 3 micrometers. The coating scheme further has an intermediate coating layer of MT-titanium carbonitride, which has a thickness equal to 3.5 micrometers, on the base coating layer. There should be an appreciation that the thickness of the intermediate coating layer of MT-titanium carbonitride coating layer can range between about 2 micrometers and about 5 micrometers. The coating scheme further includes an aluminum oxynitride coating layer, which has a thickness equal to 2.5 micrometers, on the intermediate coating layer. There should be an appreciation that the thickness of the aluminum oxynitride coating layer can range between about 2 micrometers and about 5 micrometers. Finally, the coating scheme has a coating layer of aluminum nitride on the aluminum oxynitride coating layer. The coating layer of aluminum nitride has a thickness of 0,5 micrometers, and the thickness of the aluminum nitride coating can range between about 0,3 micrometers and about 2 micrometers.

The processing details for the specific process (gas compositions, concentrations, duration, temperature and pressure) to produce the coated cutting insert of Example 3 is set forth in Table VI below.

TABLE VI

Process Parameters for Invented coating process of Example 3 (TiN—MT TiCN—AlON—AlN)

| Materials | Temperature (° C.) | Pressure (mbar) | Total Time (minutes) | Gases Present (vol %) |
|---|---|---|---|---|
| TiN | 950 | 700 | 60 | H$_2$ [balance] + N$_2$ [46 vol %] + TiCl$_4$ [1.2 vol %] |
| MT TiCN | 900 | 80 | 60 | H$_2$ [balance] + TiCl$_4$ [1.5 vol %] + CH$_3$CN [0.5 vol %] + N$_2$ [30 vol %] |
| AlON | 950 | 80 | 120 | H$_2$ [balance] + N$_2$ [36.4 vol %] + AlCl$_3$ [0.9 vol %] + CO$_2$ [0.9 vol %] + HCl [2.2 vol %] + NH$_3$ [1.5 vol %]. ( |

TABLE VI-continued

Process Parameters for Invented coating process of Example 3 (TiN—MT TiCN—AlON—AlN)

| Materials | Temperature (° C.) | Pressure (mbar) | Total Time (minutes) | Gases Present (vol %) |
|---|---|---|---|---|
| AlN | 950 | 80 | 30 | H$_2$ [balance] + N$_2$ [36.4 vol %] + AlCl$_3$ [0.9 HCl [2.2 vol %] + NH$_3$ [1.5 vol %]. |

The aluminum oxynitride coating layer (AlON) was deposited using the specific parameters as set forth for Example B in Table II hereof.

Figure 11:
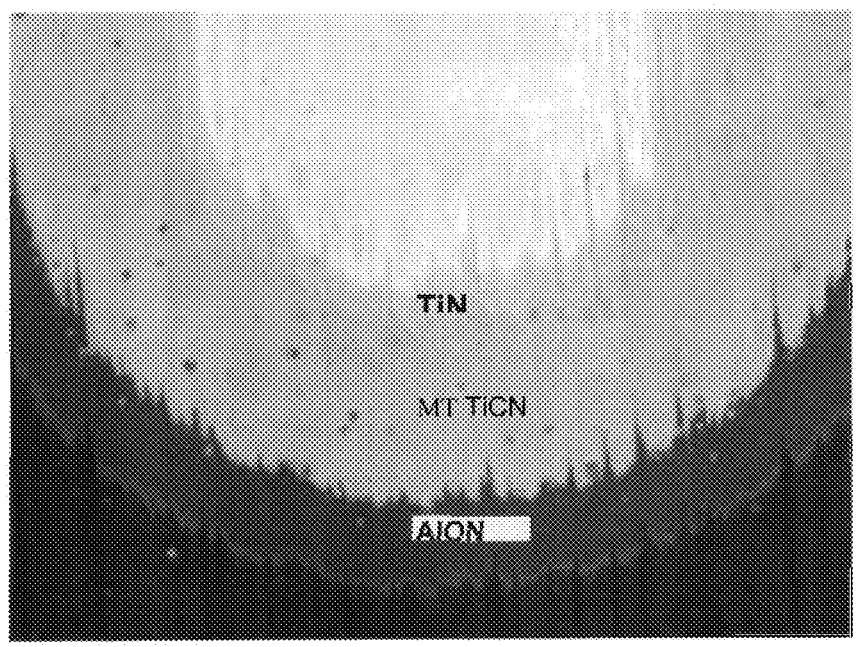
FIG. 11 is a photomicrograph in section showing the coating sequence of Example 3.

FIG. 11 is a photomicrograph showing the coating scheme of Example 3 in cross-section in a crater. In reference to FIG. 11, the coating sequence of titanium nitride, MT-titanium carbonitride, aluminium oxynitride and aluminium nitride coating layers can be seen. By a visual examination under an optical microscope at 30×, there were no visible microcracks in the aluminium oxynitride coating layer.

Example 4 is a coated cutting insert that comprises a substrate with an inventive TiN—AlON—TiOCN-alpha Al$_2$O$_3$ coating scheme thereon. The substrate comprises WC with 6.1 wt % Co and 0.15wt % vanadium. This substrate has the following properties: average grain size of the tungsten carbide is between about 1 and about 2 micrometers, porosity is A02, B02, C00, the specific gravity is between about 14.7 and about 15.1 g/cm$^3$, the Rockwell A hardness is between about 91.5 and about 92.3, the magnetic saturation is between 9.9 and 11.7 µTm3/kg, and the coercive force is between about 200 and about 243 oersteds.

The inventive coating scheme comprises a base coating of titanium nitride, which has a thickness equal to 2 micrometers. There should be an appreciation that the thickness of the titanium nitride coating layer can range between about 1.5 micrometers and about 3.0 micrometers. The coating scheme further includes an intermediate aluminum oxynitride coating layer, which has a thickness equal to 6.0 micrometers, on the base coating layer. There should be an appreciation that the thickness of the intermediate aluminum oxynitride coating layer can range between about 4.5 micrometers and about 8.0 micrometers. Still further, the coating scheme further has a coating layer of titanium carbo-oxynitride, which has a thickness equal to 0.5 micrometers, on the aluminum oxynitride coating layer. There should be an appreciation that the thickness of the titanium carbo-oxynitride coating layer can range between about 0.2 micrometers and about 1.0 micrometers. Finally, the coating scheme has an outer coating layer of alpha-aluminum oxide on the TiOCN coating layer, which has a thickness equal to 3.0 micrometers. There should be an appreciation that the thickness of the alpha-aluminum oxide coating layer can range between about 2.0 micrometers and about 5.0 micrometers.

The processing details for the specific process (gas compositions, concentrations, duration, temperature and pressure) to produce the coated cutting insert of Example 4 is set forth in Table VII below.

TABLE VII

Process Parameters for Inventive Coating Process of Example 4
(TiN—AlON—TiOCN-alpha Al$_2$O$_3$)

| Materials | Temperature (° C.) | Pressure (mbar) | Total Time (minutes) | Gases Present (Vol %) |
|---|---|---|---|---|
| TiN | 950 | 700 | 60 | H$_2$ [balance] + N$_2$ [46 vol %] + TiCl$_4$ [1.3 vol %]. |
| AlON | 870 | 80 | 180 | H$_2$ + N$_2$ + AlCl$_3$ + CO$_2$ + HCl + NH$_3$ |
| TiOCN | 1000 | 80-500 | 85 | H$_2$ [balance] + N$_2$ [8.5 vol %] + CH$_4$ [2.8 vol %] + TiCl$_4$ [1.7 vol %] + CO$_2$ [1.4 vol %] + AlCl$_3$ [1.4 vol %]. |
| Alpha Al$_2$O$_3$ | 1000 | 80 | 205 | H$_2$ [balance] + AlCl$_3$ [2.2 vol %] + CO$_2$ [3.6 vol %] + HCl [1.7 vol %] + H$_2$S [0.2 vol %]. |

The aluminum oxynitride coating layer (AlON) was deposited using the specific parameters as set forth for Example D in Table II hereof.

It thus becomes apparent that the present invention provides an improved coating cutting insert with a coating scheme that includes a coating layer of aluminum oxynitride wherein the cutting insert has improved performance properties.

It is also apparent that the present invention provides a coated cutting insert, which has an aluminum oxynitride coating layer that exhibits a reduced tensile stress up to compressive stress. Because the presence of tensile stress in the coating layer supports crack growth, a reduction in the tensile stress helps reduce the tendency for crack growth. The presence of compressive stress facilitates the avoidance of cracking and crack growth. Avoidance of cracking and crack growth is especially important for interrupted cutting applications.

Further still, it is apparent that the present invention provides a coated cutting insert, which has an aluminum oxynitride coating layer that has a lower thermal expansion property. An aluminum oxynitride coating layer with a lower thermal expansion property is comparable to the coating layer below the aluminum oxynitride coating layer exhibiting a condition of compressive stress.

In addition, it is apparent that the present invention provides a coated cutting insert, which has an aluminum oxynitride coating layer that exhibits a good thermal stability. By providing coating with good thermal stability, there is the expectation of higher wear properties and a longer tool life.

Finally, it is apparent that the present invention provides a coated cutting insert, which has an aluminum oxynitride coating layer that exhibits a high hardness. By providing a coating with a high hardness, there is the expectation of higher wear properties.

It is apparent that the present invention provides a method of making a coated cutting insert which has a coating layer of aluminum oxynitride.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A method for making a coated article, the method comprising the steps of:
   providing a substrate;
   depositing an aluminum oxynitride coating layer from a gaseous mixture, the gaseous mixture comprising:
   nitrogen in an amount between about 30.0 volume percent and about 65.0 volume percent of the gaseous mixture;
   aluminum tri-chloride in an amount between about 0.7 volume percent and about 1.3 volume percent of the gaseous mixture;
   ammonia in an amount between about 1.0 volume percent and about 2.0 volume percent of the gaseous mixture;
   carbon dioxide in an amount between about 0.1 volume percent and about 1.5 volume percent of the gaseous mixture;
   hydrogen chloride in an amount between about 1.5 volume percent and about 4.5 volume percent of the gaseous mixture;
   carbon monoxide optionally in an amount between about 0 volume percent and about 2.0 volume percent of the gaseous mixture;
   argon optionally in an amount between about 0 volume percent and about 25 volume percent of the gaseous mixture; and
   hydrogen as the balance.

2. The method according to claim 1 wherein the depositing step occurs at a temperature between about 750° C. and about 1020° C.

3. The method according to claim 1 wherein the depositing step occurs at a temperature between about 850° C. and about 950° C.

4. The method according to claim 1 wherein the depositing step occurs at a pressure between about 10 mbar and about 900 mbar.

5. The method according to claim 1 wherein the depositing step occurs at a pressure between about 50 mbar and about 100 mbar.

6. The method according to claim 1 wherein in the gaseous mixture comprising:
   the nitrogen in an amount between about 30 volume percent and about 40 volume percent of the gaseous mixture;
   carbon dioxide in an amount between about 0.2 volume percent and about 1.5 volume percent of the gaseous mixture;
   hydrogen chloride in an amount between about 1.5 volume percent and about 3.0 volume percent of the gaseous mixture.

7. The method according to claim 6 wherein in the gaseous mixture comprising carbon dioxide in an amount between about 0.2 volume percent and about 0.6 volume percent of the gaseous mixture.

8. The method according to claim 6 wherein in the gaseous mixture comprising carbon dioxide in an amount between about 0.7 volume percent and about 1.5 volume percent of the gaseous mixture.

9. The method according to claim 6 wherein in the gaseous mixture comprising carbon dioxide in an amount between about 0.5 volume percent and about 1.3 volume percent of the gaseous mixture.

10. The method according to claim 1 wherein in the gaseous mixture comprising:

the nitrogen in an amount between about 40 volume percent and about 50 volume percent of the gaseous mixture;
aluminum tri-chloride in an amount between about 0.7 volume percent and about 1.0 volume percent of the gaseous mixture;
ammonia in an amount between about 1.0 volume percent and about 1.6 volume percent of the gaseous mixture;
carbon dioxide in an amount between about 0.6 volume percent and about 1.4 volume percent of the gaseous mixture;
hydrogen chloride in an amount between about 1.5 volume percent and about 2.5 volume percent of the gaseous mixture.

11. The method according to claim 1 wherein in the gaseous mixture comprising:
the nitrogen in an amount between about 60 volume percent and about 65 volume percent of the gaseous mixture;
aluminum tri-chloride in an amount between about 0.7 volume percent and about 1.0 volume percent of the gaseous mixture;
ammonia in an amount between about 1.0 volume percent and about 1.6 volume percent of the gaseous mixture;
carbon dioxide in an amount between about 0.6 volume percent and about 1.5 volume percent of the gaseous mixture;
hydrogen chloride in an amount between about 1.5 volume percent and about 2.5 volume percent of the gaseous mixture.

12. The method according to claim 1 wherein in the gaseous mixture comprising:
the nitrogen in an amount between about 60 volume percent and about 65 volume percent of the gaseous mixture;
aluminum tri-chloride in an amount between about 0.7 volume percent and about 1.0 volume percent of the gaseous mixture;
ammonia in an amount between about 1.0 volume percent and about 1.6 volume percent of the gaseous mixture;
carbon dioxide in an amount between about 0.6 volume percent and about 1.5 volume percent of the gaseous mixture;
hydrogen chloride in an amount between about 2.5 volume percent and about 3.6 volume percent of the gaseous mixture.

13. The method according to claim 1 wherein the aluminum oxynitride having a composition comprising aluminum in an amount between about 20 atomic percent and about 50 atomic percent, nitrogen in an amount between about 40 atomic percent and about 70 atomic percent, and oxygen in an amount between about 1 atomic percent and about 20 atomic percent.

14. The method according to claim 1 wherein the aluminum oxynitride having a composition comprising aluminum in an amount between about 32 atomic percent and about 38 atomic percent, nitrogen in an amount between about 63 atomic percent and about 67 atomic percent, and oxygen in an amount between about 4 atomic percent and about 6 atomic percent.

15. The method according to claim 1 wherein the substrate comprising a cutting tool substrate having a cutting edge whereby the coated article being a coated cutting tool.

16. The method according to claim 1 wherein the substrate comprising a wear part substrate having a wear surface whereby the coated article being a coated wear part.

17. A method for making a coated article, the method comprising the steps of:
providing a substrate;
depositing an aluminum oxynitride coating layer from a gaseous mixture, the gaseous mixture comprising:
nitrogen in an amount between about 30.0 volume percent and about 65.0 volume percent of the gaseous mixture;
aluminum tri-chloride in an amount between about 0.7 volume percent and about 1.3 volume percent of the gaseous mixture;
ammonia in an amount between about 1.0 volume percent and about 2.0 volume percent of the gaseous mixture;
carbon dioxide in an amount between about 0.1 volume percent and about 1.5 volume percent of the gaseous mixture;
hydrogen chloride in an amount between about 1.5 volume percent and about 4.5 volume percent of the gaseous mixture;
carbon monoxide optionally in an amount between about 0 volume percent and about 2.0 volume percent of the gaseous mixture;
argon optionally in an amount between about 0 volume percent and about 25 volume percent of the gaseous mixture;
hydrogen as the balance; and
wherein the aluminum oxynitride comprises a mixture of phases having a hexagonal aluminum nitride type structure (space group: P63mc), a cubic aluminum nitride type structure (space group: Fm-3m), and optionally amorphous structure.

* * * * *